(12) United States Patent
Maly (10) Patent No.: US 8,321,057 B2
(45) Date of Patent: Nov. 27, 2012

(54) INFRASTRUCTURE FOR ADAPTIVE ENVIRONMENTAL CONTROL FOR EQUIPMENT IN A BOUNDED AREA

(75) Inventor: James Brian Maly, New York, NY (US)

(73) Assignee: Red Hat, Inc., Raleigh, NC (US)

( * ) Notice: Subject to any disclaimer, the term of this patent is extended or adjusted under 35 U.S.C. 154(b) by 436 days.

(21) Appl. No.: 12/402,998

(22) Filed: Mar. 12, 2009

(65) Prior Publication Data

US 2010/0235003 A1    Sep. 16, 2010

(51) Int. Cl.
| | |
|---|---|
| G05B 21/00 | (2006.01) |
| G05B 13/00 | (2006.01) |
| G05B 15/00 | (2006.01) |
| G01M 1/38 | (2006.01) |
| G05D 23/00 | (2006.01) |
| G01K 1/08 | (2006.01) |
| G06F 15/173 | (2006.01) |
| G06F 3/00 | (2006.01) |
| G06F 9/44 | (2006.01) |
| G06F 9/46 | (2006.01) |
| G06F 13/00 | (2006.01) |

(52) U.S. Cl. ........ 700/278; 700/300; 702/132; 709/224; 719/328

(58) Field of Classification Search .................. 700/275, 700/276, 299, 300, 277, 278; 702/130, 132, 702/136, 188; 709/223, 224; 713/300, 320; 719/328

See application file for complete search history.

(56) References Cited

U.S. PATENT DOCUMENTS

| | | | |
|---|---|---|---|
| 6,662,231 B1 * | 12/2003 | Drosset et al. | 709/229 |
| 6,714,977 B1 * | 3/2004 | Fowler et al. | 709/224 |
| 7,475,274 B2 * | 1/2009 | Davidson | 714/4.4 |
| 7,533,168 B1 * | 5/2009 | Pabla et al. | 709/224 |
| 7,676,280 B1 * | 3/2010 | Bash et al. | 700/17 |
| 2004/0264124 A1 | 12/2004 | Patel et al. | |
| 2005/0060440 A1 | 3/2005 | Meynard et al. | |
| 2005/0172650 A1 | 8/2005 | Hermerding | |
| 2005/0216222 A1 | 9/2005 | Inoue | |
| 2005/0216775 A1 | 9/2005 | Inoue | |
| 2007/0124684 A1 | 5/2007 | van Riel | |
| 2008/0301473 A1 * | 12/2008 | Perez et al. | 713/300 |
| 2009/0228726 A1 * | 9/2009 | Malik et al. | 713/320 |
| 2009/0265568 A1 * | 10/2009 | Jackson | 713/320 |
| 2010/0076933 A1 * | 3/2010 | Hamilton et al. | 707/640 |

* cited by examiner

*Primary Examiner* — Crystal J Barnes-Bullock
(74) *Attorney, Agent, or Firm* — Lowenstein Sandler PC (57) ABSTRACT

Integrating information and performance controls for individual devices with environmental controls. Integrating the individual devices with general environmental control enables adaptive environmental control. For equipment housed in a bounded space such as a server room, information about the thermal environment within the bounded space can affect the performance of the equipment. Additionally, information about the performance conditions and/or thermal conditions about a piece of equipment can affect how the environmental control system for the bounded space operates. The equipment exchanges environmental event messages with a control node to affect the performance of the equipment and/or the environmental control system.

21 Claims, 5 Drawing Sheets

INFRASTRUCTURE FOR ADAPTIVE ENVIRONMENTAL CONTROL FOR EQUIPMENT IN A BOUNDED AREA

FIELD

The invention is generally related to environmental control related to computing equipment, and particular embodiments relate to adapting environmental control based on performance and/or thermal information of individual devices.

COPYRIGHT NOTICE/PERMISSION

At least a portion of the disclosure of this patent document contains material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2008, Red Hat, Inc., All Rights Reserved.

BACKGROUND

Racks of equipment are commonly used in data routing (e.g., racks of routers, banks of modems), data storage (e.g., banks of storage devices), and data access (e.g., racks of servers). Typically, such racks of equipment or racks of devices are housed in a confined or bounded area or physical space. In confined areas (e.g., server rooms, data centers), the operation of the equipment can generate a significant amount of heat that could negatively affect the performance of the equipment. Thus, server rooms or their equivalent generally include cooling systems or environmental control systems. On top of the economic cost associated with running the equipment, the owner/operator of the equipment must also be concerned with the economic costs of running the environmental control systems.

Additionally, some server rooms house many (dozens or hundreds) of devices, which may make controlling the environment of the bounded space inefficient, given that the entire room may be controlled based on the operation of a particularly active hardware device or devices. Even in rooms that are separated into zones of environmental control, the reactive nature of the environmental control systems may not effectively increase or reduce cooling to the equipment based on actual performance of the individual devices. Thus, the environmental control systems may be inefficient, resulting in increased costs associated with running the environmental control systems.

BRIEF DESCRIPTION OF THE DRAWINGS

The following description includes discussion of figures having illustrations given by way of example of implementations of embodiments of the invention. The drawings should be understood by way of example, and not by way of limitation.

DETAILED DESCRIPTION

An infrastructure enables the use of internal environmental information and performance controls of equipment in coordination with an environmental control system of a bounded area in which the equipment is housed. Thus, for example, data center environmental systems can be integrated with the operating system of individual devices. The infrastructure includes a master node in communication with the hardware devices. The hardware devices are slave nodes, and the master node and the slave nodes together make up an environmental event network, where environmental information is exchanged between the master and the slaves. The exchange of environmental information includes either information about internal performance of the slave node devices and/or the control of the operation of the slave node devices to adaptively control the environment of the bounded area.

The infrastructure provides a "green engineering" initiative that increases the efficiency of the environmental control of the devices of the bounded area, which saves energy and decreases the cost of operation. In one embodiment, the infrastructure includes an operating system level API (application programming interface), which allows individual hardware devices (e.g., servers) to communicate internal environmentals (e.g., operating conditions such as internal temperature, or load that may increase or decrease the internal temperature) to the environmental control system of the bounded area. Additionally, such an API could allow the environmental control system to communicate with the individual hardware devices to cause the devices to alter performance in response to an event external to the device (e.g., increased heat in the bounded area, break-down in the environmental controls, business event, etc.). The infrastructure enables, for example, merging server room environmental controls and servers themselves to function as one dynamic and cohesive system.

Current systems have sensors placed around a server room (or other bounded space), which are connected to a control unit that cannot be integrated with the individual devices in the server room. The devices themselves typically have, e.g., scripts or other logic to handle events such as overheating, but do not dynamically respond to changing conditions of the server room. Instead, the devices can only react to significant local events. In contrast, finer-grain control of the server room can be provided with the infrastructure described herein. The individual hardware devices can provide input consideration of how the cooling system of the server room is to operate.

The adaptive environmental control infrastructure provides bi-directional communication functionality to allow devices to coordinate with the environmental control system of a bounded space. Consider a server room housing multiple servers. With the adaptive environmental control infrastructure, the servers communicate with the environmental control system to identify events or conditions that might cause the system to increase or decrease cooling to a particular zone or group of devices. Additionally, the server room (environmental control system) can communicate with the servers to notify the servers of server room related environmental events such as overheating, power failure, the beginning or end of the business day, start and end of peak computing period, etc., where more power or less power would be required.

In one embodiment, the infrastructure includes an API at the hardware devices of the bounded space. The API may include a daemon process (such as a kernel-level module, or a userspace application) running on each device in the bounded space. Such a daemon process may read temperatures, CPU (central processing unit) frequencies, power consumption levels, and other internal environmentals that might be of interest to the environmental control system. It will be understood that such reading may be made on most equipment without the addition of additional sensors, or without any hardware modification at all. The internal information is relayed back to a controller of the environment control system for the bounded space. The controller can then direct more or less cooling to each hardware device as needed. Further, such a daemon process can respond to events broadcasted by the the environmental control system controller, and cause each hardware device to adapt dynamically to the broadcast. For example, the hardware devices may respond to such broadcasted events by changing internal power consumption levels, or changing internal thermal (heat) output. Such granular control is possible with the daemon process communicating directly with a kernel of the operating system.

As examples, consider the following events, and responses to these events: 1) A server room cooling system cannot keep up with the heat output from the servers, and broadcasts a message that the server room is overheating—the daemon process (API) on each server could respond by enforcing thermal threshold to reduce thermal output; 2) A data center experiences a power failure (e.g., failover to UPS (uninterruptible power supply) or generator) or power shortage, and broadcasts a message indicating the power interruption/failure—the daemon process (API) on each server could respond by cutting power consumption to an absolute minimum; 3) The beginning of the business day begins (start of peak computing hours), and a control system sends a message to hardware devices—the daemon process (API) on each hardware device could respond by optimizing the dynamics of each hardware device for a zero-latency mode to put the device in full power mode (no power savings), which readies the devices for maximum throughput with no energy savings being employed; and, 4) The end of the business day is reached (end of peak computing hours), and a control system sends a message to hardware devices—the daemon process (API) could respond by putting the hardware devices in a power savings mode, reducing power consumption to a minimum without concern for latency issues that may result.

The master node could be considered part of the control system, or could be incorporated into the control system. In one embodiment, the master node is a server dedicated to managing the environmental event information. In a room full of servers, the master node may be one of the servers. In a room of equipment other than servers, one of the pieces of equipment may be configured to act as a master node, or a server may be included in the room. The master node includes software that reads the environmental conditions from the server room itself, such as from sensors or control devices that are part of the environmental control system, and each of the functional hardware devices that serves and/or routes data (as opposed to devices that are auxiliary, such as the environmental control devices). Additionally, the master node could read environmental conditions from a power system of the bounded space, and various pieces of scheduling software such as batch managers. The batch manager software could make decisions based on internal logic that enforces a defined level of symmetry between the needs of the functional hardware devices, the cooling system, the power systems, and the scheduling software and batch managers. The batch manager software would attempt to achieve maximum power savings by balancing bounded space and hardware device internal conditions based on business and/or computing priorities. As part of a configuration of the batch software itself, or as part of the information passed to the master node, the batch software can be made aware of the limits of the cooling capacities and status, the power system capacities and status, device-internal thermal limitations and status, and the device-internal minimum and maximum power usage (per device) and status.

Figure 1:
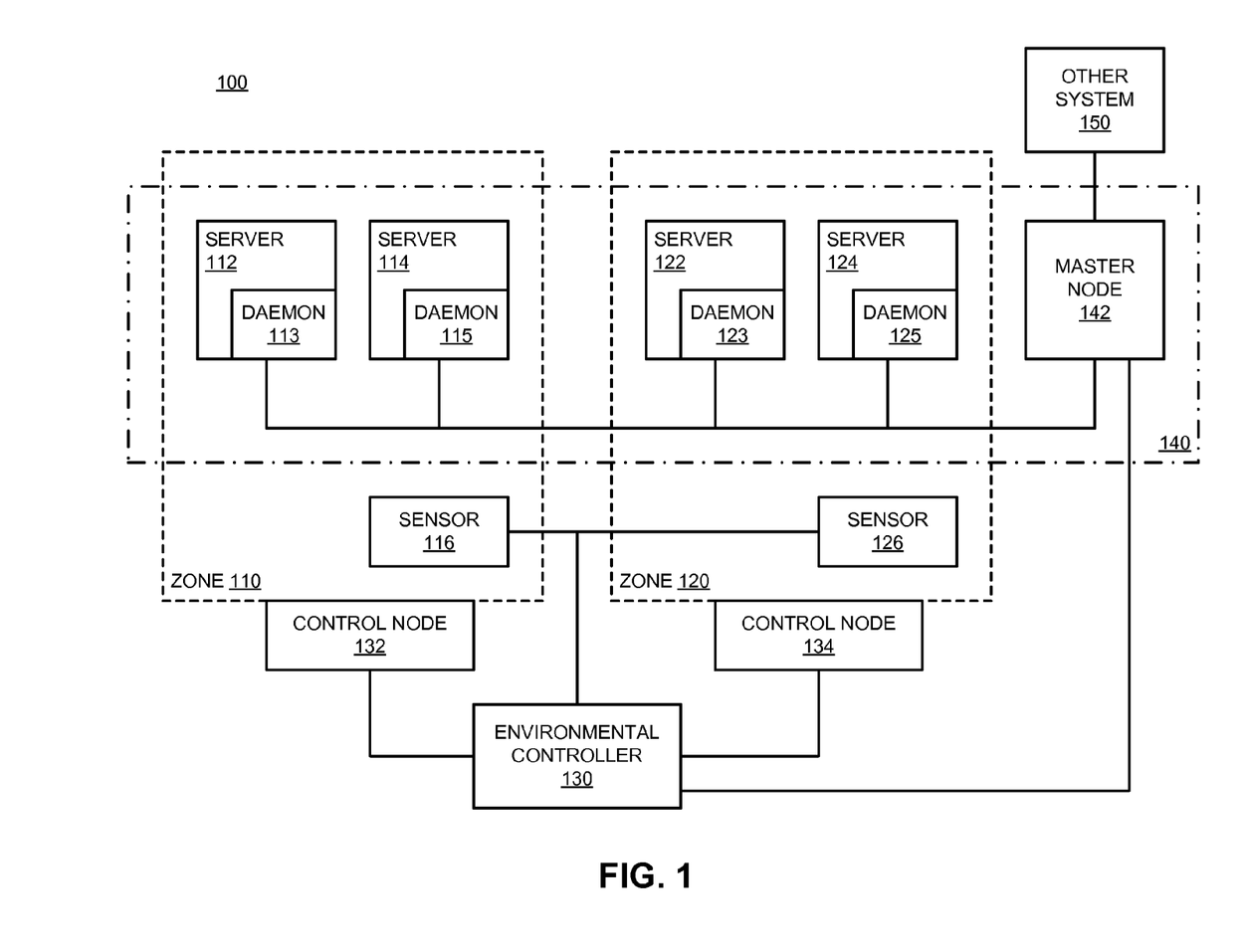
FIG. 1 is a block diagram of an embodiment of a system having a master node that integrates information about individual servers with environmental control of a bounded space in which the servers are housed.

FIG. 1 is a block diagram of an embodiment of a system having a master node that integrates information about individual servers with environmental control of a bounded space in which the servers are housed. System 100 represents a bounded space such as a server room, data center, or other room or confined or bounded space for equipment for data routing, data storage, or data access. The equipment is integrated into the system from the perspective of environmental control. The equipment is illustrated by servers 112, 114, 122, and 124. It will be understood that while reference is made specifically to "servers" as an example, these teachings apply equally well to a bounded space having servers, routers, data storage devices, or a combination of these. Collectively, these devices may be said to provide data access services. For example, servers respond to requests by "client" devices (not shown) to process the requests for data access. The data storage devices enable access to data for reading and writing, the servers may also provide such data for reading or writing as well as executing applications, and routers route data to be accessed.

In one embodiment, the servers are separated into zones 110 and 120. It will be understood that system 100 does not need to be separated into zones. Separation of the area into zones can make directed cooling easier. As shown, zone 110 includes servers 112 and 114, which has associated sensor 116. Sensor 116 may be, for example, a temperature sensor commonly used in environmental control systems. Traditionally, the environmental control system would use sensor 116 to determine a thermal condition or thermal environment of zone 110, and may direct more or less cooling to the zone based on sensor readings.

The environmental control system traditionally includes environmental controller 130, control nodes 132 and 134, and sensors 116 and 126. Sensors 116 and 126 are connected to environmental controller 130 (with either individual connections, or via a common bus), which performs computations to determine how to cool system 100. Control nodes 132 and 134 represent air flow registers or vent, fans, cooling systems, etc., which combine to direct cooled air at system 100, or a part of the system (e.g., a specific zone). It will be understood that more zones could be used. In one embodiment, one rack of equipment corresponds to one zone.

In one embodiment, the cooling system of system 100 can be a separated section of zones like an HVAC (heating, ventilation, and air conditioning) system, where each equipment stack has a connection. While there is no restriction on the type of cooling or ventilation used, cooling frequently is directed up through the floor, or down from the ceiling across a rack. Vents may be spaced within every 3 m×3 m space, for example. The cooling system can direct more or less airflow to certain zones or vents based on how much cooling is needed.

In addition to traditional components, master node 142 is coupled to environmental controller 130 to integrate not only information from the sensors, but information from the servers into decisions about environmental control. In one embodiment, master node 142 and environmental controller 130 are combined as a single unit, but such an architecture is not necessary. For purposes of discussion, master node 142 and environmental controller 130 are discussed herein as separate, and reference may be made to the master node sending a message to the environmental control system. It will be understood that to the extent some or all of the functions of environmental controller 130 are integrated into master node 142 (or the functions of master node 142 are integrated into an extended environmental controller 130), exchange of such messages may refer to the passing of information between modules, or between subroutines within the single device.

Master node 142 is also part of environmental event network 140. The servers are also part of the environmental event network. The servers act as slave nodes in the network, and report conditions that could affect the thermal environment of the server, such as CPU frequency, data throughput, temperature, load (e.g., traffic or number of requests), or other conditions that may cause a server to perform more processing and run hotter, or perform less processing and run cooler. Master node 142 watches or monitors what is happening in network 140. Master node 142 receives and monitors events in the network. An event refers to any condition that represents a change of current operating conditions. In one embodiment, an event is anything that diverges from the dynamic cooling expectations. Thus, a response to a heavy traffic load could be an event, as well as power surges or lapses, reaching of thermal thresholds, etc. As mentioned above, master node 142 is connected to environmental controller 130, and can send a message or other affect how the environmental control system operates. Network 140 can thus operate as an event messaging system with integrated environmental control.

Thus, rather than waiting for indications from the sensors in the zones, the system can be responsive to the cues from each individual server about its performance, and especially its thermal or environmental state. Thus, server internals or information on a server's local thermal environment can be the principal information used to direct the cooling, with the sensors in the system primarily serving as backup or as a failsafe. Thus, the system is much more efficient in its use of cooling and environmental control, because it is performing on a micro-level of environmental control rather than a macro-level of control.

In one embodiment, other systems 150 could provide information to master node 142. Such "other systems" may actually be scripts, schedulers, or batch jobs executing on master node 142, which are part of business systems that indicate schedules for particular operations to occur. Thus, with master node 142, the system can for example hook into the scheduler and address power and latency concerns. Similar functions are possible through tying into batch systems.

Based on information received from the servers and/or from another system 150, master node 142 may send one or more messages, such as a control message or instruction to the environmental control system (e.g., to environmental controller 130) to cause the system to adapt environmental control of system 100. Such adaptation may include directing more or less cooling through control nodes 132 and/or 134.

In one embodiment, each server may be able to detect certain internal conditions related to thermal environment and/or performance (e.g., temperature and/or load, CPU frequency, data throughput, power usage), but has little or no "intelligence" for decision-making based on the conditions. Each server may have scripts that direct slowing down CPU frequency or performing other actions if an internal thermal threshold is reached, but may be very limited in this respect. Instead, master node 142 includes intelligence to identify conditions and direct actions to servers and/or the environmental control system. The intelligence may be or include a heuristic algorithm, which would be implementation specific related to the amount of equipment, the type of equipment, the size of the room, the architecture and capability of the environmental controls, and current status of each of these. Lookup tables may be provided for certain conditions (e.g., especially common scenarios), but are again dependent on the implementation.

Consider that the CPU (not shown) on server 112 is running hot. Server 112 recognizes the CPU is running too hot as it approaches its thermal limits (which is set by configuration for the particular device). As it approaches the thermal limit, server 112 could cause an automatic process to occur, and would not need to wait for the thermal limit to be reached before performing an action in response to the overheating. For example, the server could broadcast or send a message to master node 142 to indicate that its proximity to the thermal limit, and allow the master node to perform an action in response to the indication. In one embodiment, in response to the message from server 112, master node 142 can send more cooling to control node 132 for the zone or group of servers to which server 112 belongs.

The message may be sent via daemon 113. Each server, 112, 114, 122, 124 has an associated daemon 113, 115, 123, 125, respectively. Each daemon can respond to the internal conditions by creating an event and event message to send to master node 142. The daemon can then monitor for messages sent from master node 142, such as a message indicating to cut back CPU frequency, place the system in a sleep mode, or take another defined action.

While certain descriptions are made with more particular reference to system 100, a general description applicable to any one or more embodiments described herein follows. The infrastructure allows a master node and slave nodes to exchange messages to affect an operation of either the slave and/or the master, based on environmental conditions or events. The master node communicates with peripherals of the bounded space, and conducts the environmental control operation within the bounded space.

A communication interface enables slave devices and a master node to participate in an environmental event information network. The interface integrates environmental controls and conditions and event information. When operated as an event driven system, the environmental event information network can be activated by environmental condition detection, scheduled events, batch events, and/or business events. Each slave device changes its operation based on an event indicated by the master node, or transmits an event to the master node based on internal conditions that generate an event within the network. The master node can then make a decision based on the event to direct environmental control of the bounded space.

In one embodiment, the infrastructure described herein can be used in conjunction with what is frequently referred to as "dynamic cooling" technology that is targeted to server room environmental control systems. The dynamic cooling technology is generally described as a system that separates a server room into different zones, and controls the environment of each zone based on sensor detection within the zone. However, such dynamic cooling alone has drawbacks. For example, by the time the zone sensor can detect and respond to the changes in the environment, a particular device may be running too hot. Dynamic cooling can be extended by the infrastructure described herein with the interface that allows each device to report back internal temperatures to the server room environmental controls. Thus, the server room control can direct more cooling or less cooling to individual servers or groups of servers as required. Such a unidirectional communication from a server to a server room controller can further be extended by providing the bi-directional communication possible with the infrastructure described herein to allow the server room controller to communicate with the servers and notify them of environmental events in the server room.

With the environmental event network and environmental control system infrastructure, environmental control of a bounded space can be adaptive to the temperature constraints within each individual hardware device. The overall environmental control system becomes much more efficient by responding to hardware device performance rather than external environment sensor readings. In one embodiment, the sensor system can be retained, but would primarily act as a backup or failsafe, rather than providing the primary conditions for environmental control consideration. Contrasted with prior systems, power failure, system overheating, or other events could be reported back to the environmental control system. The hardware devices themselves may be configured to cut back on throughput, reduce heat output, etc., in response to a particular event, which alters the normal focus on reducing latency in responding to requests.

Figure 2:
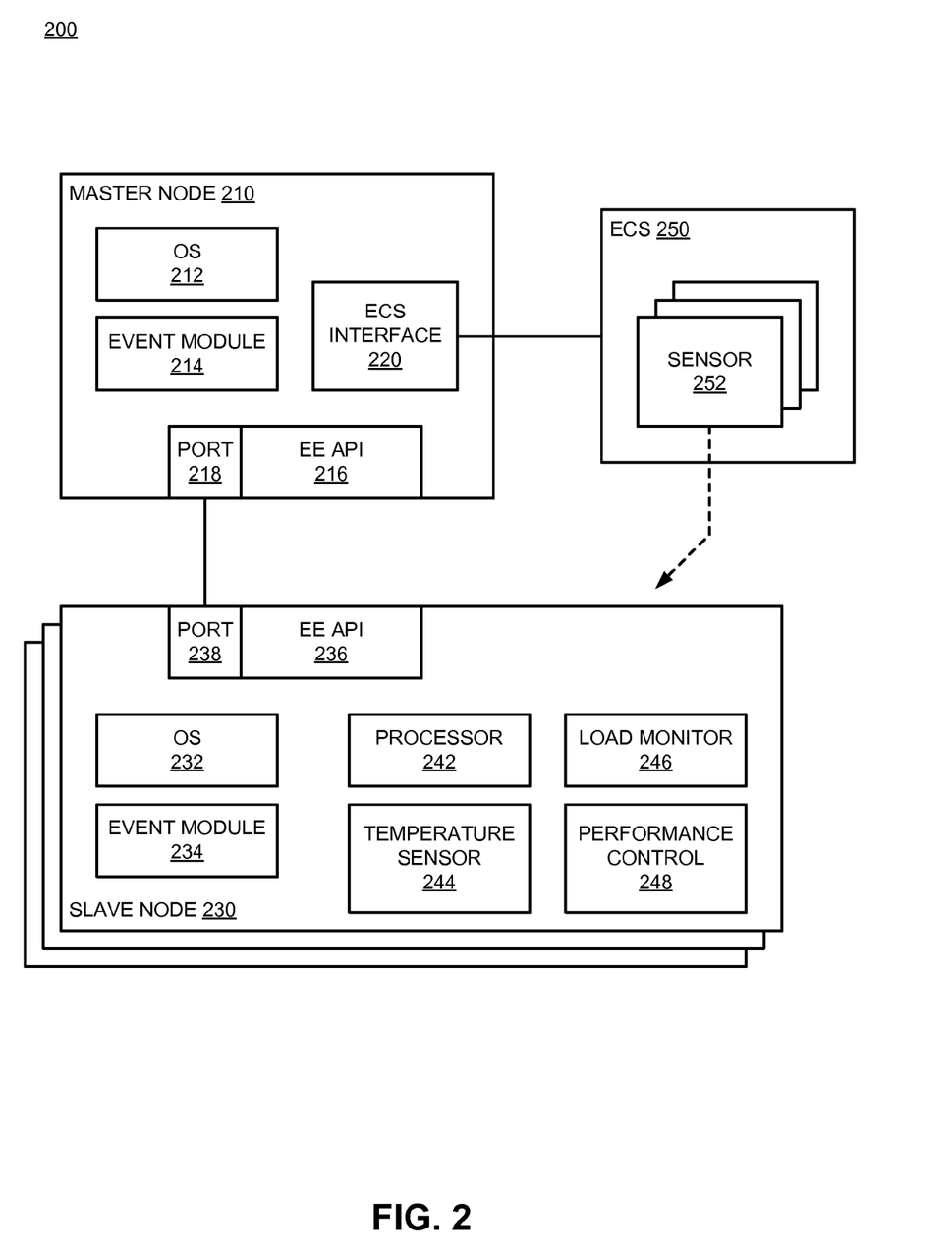
FIG. 2 is a block diagram of an embodiment of a system with a master node and slave nodes in an environmental event network.

FIG. 2 is a block diagram of an embodiment of a system with a master node and slave nodes in an environmental event network. System 200 represents an example of bounded space having multiple devices, such as system 100 of FIG. 1, and shows additional potential details of one embodiment of such a system.

Master node 210 coordinates the integration of individual device information and controls into the use of the environmental control system (ECS). Master node 210 includes operating system (OS) 212 that controls the operation of the master node. In one embodiment, master node 210 includes event module 214, which represents one or more components that receive and send messages related to environmental events, including processing modules to determine how to respond to the events. Event module 214 may include interfaces to the slave nodes to receive the local environmental information from each slave node and determine what actions to take in system 200 to address the conditions or events representing the local environmental information.

Master node 210 include EE API 216, which refers to an "environmental event" API, which could be the daemon discussed above, for example. EE API 216 is associated with event module 214, and represents a control system to receive and coordinate messages to affect the thermal environment of the bounded space of system 100. The control system could be implemented in kernel space, for example, as a kernel module. Alternatively, the control system components could be implemented as a driver module instead of built into the kernel. There could be API controls (an API module or API hooks) in a kernel module, and daemon reading processes in user space, or another combination. The control system issues commands or message to affect the CPU frequency and the temperature control of individual slave nodes (or affect them collectively with a broadcast message). One example implementation of the event module is to implement it in the /sys filesystem, where values are commonly written. One implementation in Linux would allow the master node 210 to be a module running within OS 212 of a hardware device, where various software components may be implemented in user-space, and for example, could be POSIX compliant, etc., to enhance buildability of the system.

Master node 210 is illustrated with port 218, which represents hardware and/or software components that enable master node 210 to communicate with slave node 230 (and other slave nodes). In one embodiment, all that is required for EE API 216 is an open socket for a daemon process. The open socket allows the daemon process on the slave node to either read information (and adjust internal parameters in accordance with what is read), or to write internal information back to master node 210. The kernel could then "listen" or monitor the communication interface for messages. In one embodiment, master node 210 is implemented in an embedded firmware controller, and could thus be built into hardware devices to create and operate an environmental event network.

Master node includes ECS interface 220, which represents one or more components that enable master node 210 to connect to environmental control system (ECS) 250. ECS 250 generically represents the hardware and software components that monitor and adjust the environment of system 200. The environment of system 200 may be referred to as an "external" environment from the perspective that it is external to any given slave node, which each may have a unique internal environment. The external environment of slave node 230 and other slave nodes may be monitored by sensors 252, as discussed above, which monitor the external environment and report to the ECS what the environmental conditions of system 200 are.

Slave node 230 includes similar components corresponding to components of master node 210. For example, in one embodiment, slave node 230 includes OS 232, event module 234, EE API 236, and port 238. Additional details illustrated include processor 242, temperature sensor 244, load monitor 246, and performance control 248. The addition of processor 242 in slave node 230 does not imply that master node 210 does not have a processor. Rather, the inclusion of processor 242 in slave node 230 highlights the fact that the environmental conditions such as temperature, and the performance or load conditions of processor 242 may be coordinated with the operation of ECS 250. Processor 242 may be any type of processor, including multi-core or multi-threaded processors.

Temperature sensor 244 may be distinguished from sensors 252 of ECS 250. Temperature sensor 244 is typically built into the processor or chipset of slave node 230, and indicates the internal environment associated with the processor or chipset. Such a sensor is typically included in the hardware of slave node 230—thus, additionally hardware may not be necessary to monitor the internal environment of slave node 230.

Load monitor 246 refers to hardware and software mechanisms known in the art to detect the load on processor 242, whether the load is from computations, data access processing (e.g., reading or writing), packet forwarding or routing, etc. Performance control 248 represents any mechanism included within slave node 230 to adjust its performance. Such mechanisms may include, but are not limited to, processes to enter a sleep mode, processes to reduce or increase CPU frequency, processes to reduce or increase workload, etc.

Figure 3A:
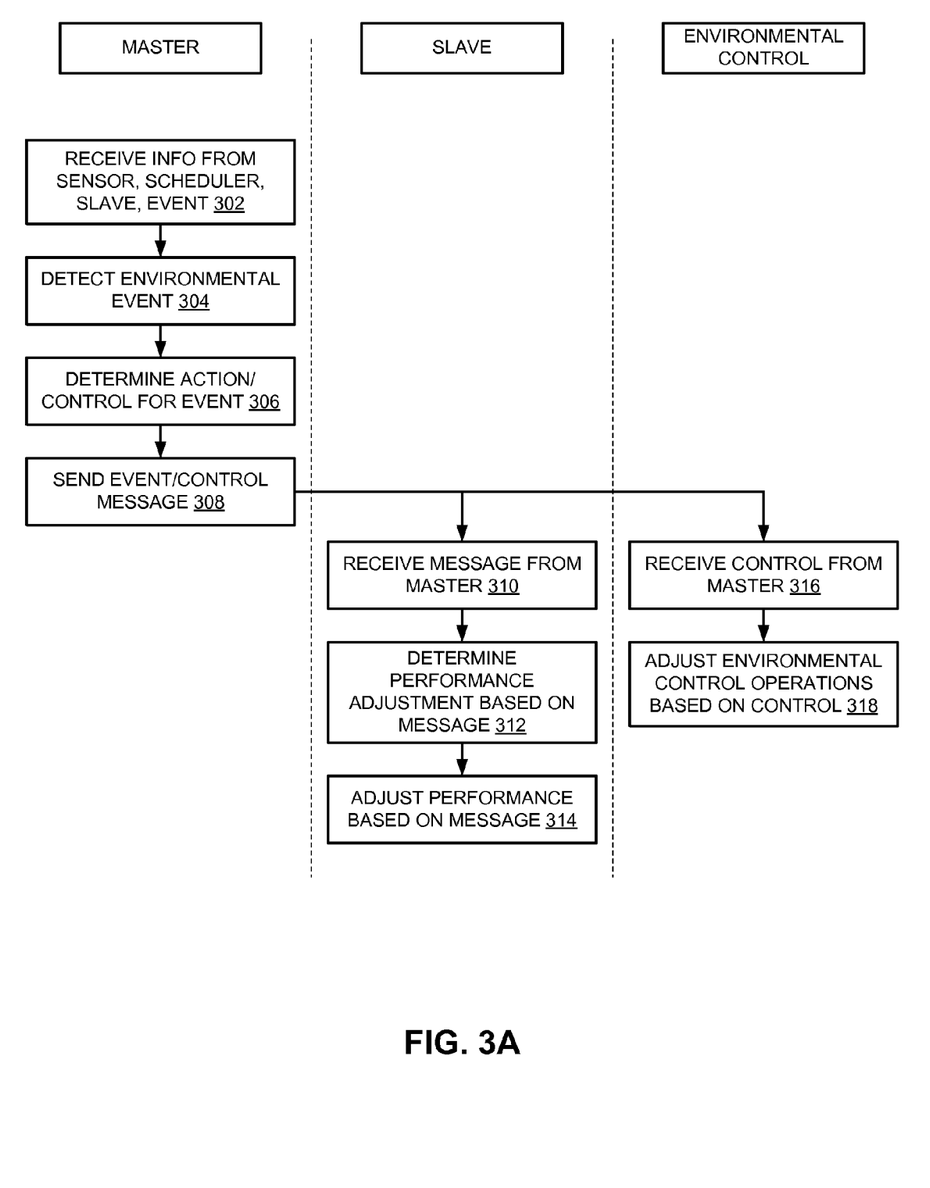
FIG. 3A is a flow diagram of an embodiment of a method for a master node triggering an operation based on event information.

FIG. 3A is a flow diagram of an embodiment of a method for a master node triggering an operation based on event information. The method or process may be performed by processing logic that may include hardware (e.g., circuitry, programmable logic, microcode, etc.), software (such as instructions run on a processing device), or a combination thereof. For convenience, reference is made to components that might perform one or more of the operations described below. Reference to particular components may not necessarily be exclusive, and other components not specifically called out may perform one or more of the following operations.

In a bounded space (e.g., system 100 of FIG. 1, system 200 of FIG. 2), a master node (e.g., 142, 210) is coupled to a slave node (e.g., 112, 114, 122, 124, 230) in an environmental event network (e.g., 140). The master node is also coupled to an environmental control system (e.g., 250). The master node receives information from a sensor of the environmental control system, a scheduler or batch system, a slave node, or another event source, 302. The information indicates a condition related to or that affects the thermal environment of a slave node. From the information, the master node detects an environmental event, 304. The master node determines an action and/or control to respond to the event, 306. The master node sends out an event or control message to one or more slave node(s) and/or to an environmental control system, 308.

If a message is sent to a slave node, the slave node receives the message from the master node, 310, and determines a performance adjustment based on the received message, 312. The adjustment may be to reduce performance, or increase performance, depending on the message. Performance may be reduced if a message indicates a condition that has a negative effect on the thermal environment of the bounded space. If a message indicates a negative condition has ended, or if an increase in performance is needed, performance may be increased. The slave node adjusts its performance based on the message, 314.

If a message or control command is received at the environmental control system, the system receives the control from the master node, 316. The environmental control system may then increase or decrease its environmental control operations to one or more areas of the bounded space based on the control, 318.

Figure 3B:
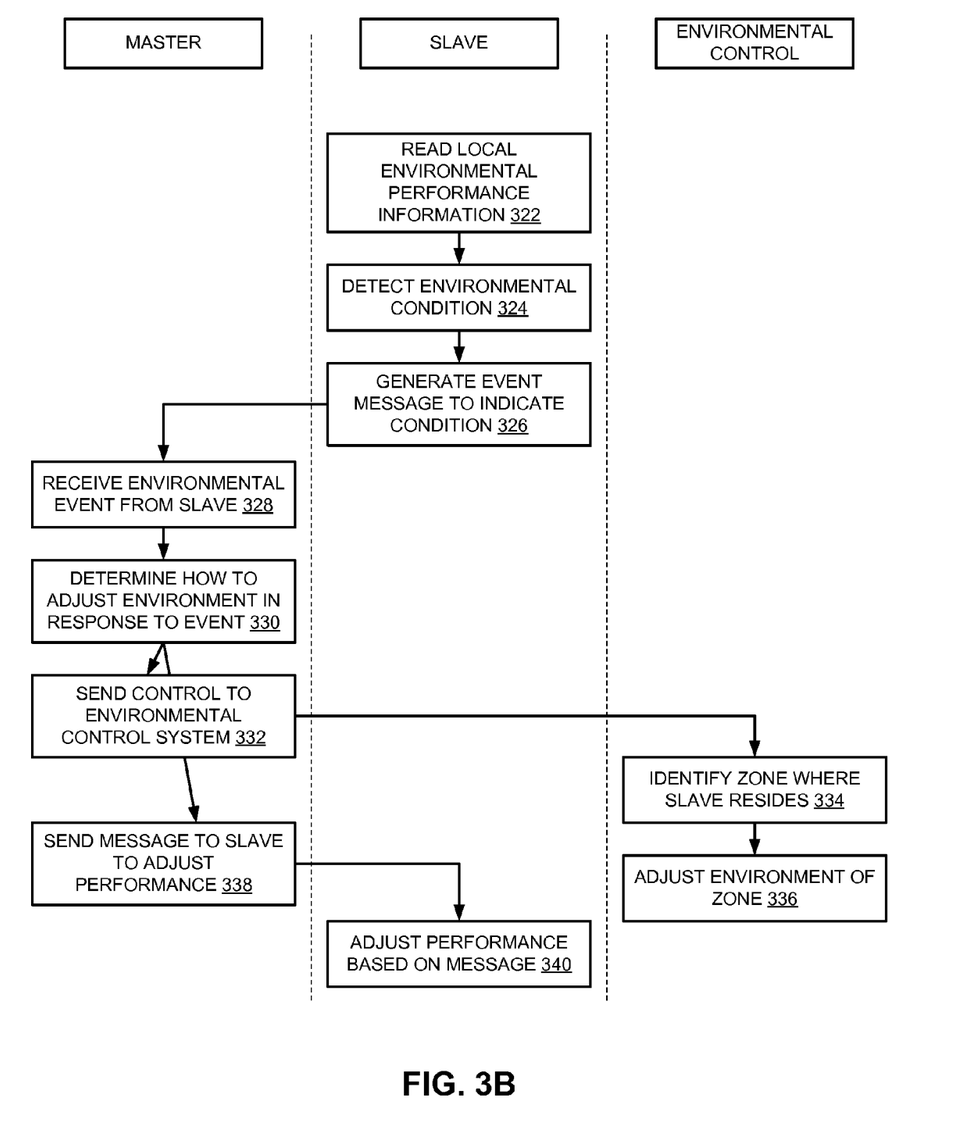
FIG. 3B is a flow diagram of an embodiment of a method for a slave node generating an event based on local information.

FIG. 3B is a flow diagram of an embodiment of a method for a slave node generating an event based on local information. The method or process may be performed by processing logic that may include hardware (e.g., circuitry, programmable logic, microcode, etc.), software (such as instructions run on a processing device), or a combination thereof. For convenience, reference is made to components that might perform one or more of the operations described below. Reference to particular components may not necessarily be exclusive, and other components not specifically called out may perform one or more of the following operations.

Where the event was shown as being detected in the master node with respect to FIG. 3A, in FIG. 3B, the detection of a condition by a slave node is highlighted. The slave node may read a local environmental performance indicator, 322. Such a read may be performed, for example, by a daemon process that monitors operating statistics or conditions of the slave node. The slave node may detect an environmental condition in the read information, 324. It will be understood that as used here, a condition is an "environmental condition" if it affects the operating environment of the slave node. Most conditions having to do with the internal temperatures and the amount of processing to be performed by the slave node can be considered an "environmental condition" that affects the thermal environment of the slave node. Examples of such conditions could include a temperature reading, as well as determining that a high volume of requests for processing have been received. The slave node generates an event message (or generates an "event") to indicate the condition to the master node, 326.

The master node receives the environmental event from the slave node, 328, and determines how to adjust the environment in response to the environmental event, 330. The master node may cause the slave node to adjust its operation in response to the event, and/or could cause the environmental control system to adjust environmental control operations in response to the event. In one embodiment, both the slave node and the environmental control system can be directed to perform operations substantially simultaneously, or substantially in parallel. Operations may occur in parallel if one is started independently of completion of the other and at least partially overlaps temporally.

The master node may send a control to the environmental control system, 332. The environmental control system receives the control and may identify a zone with which the slave node is associated, or a zone in which the slave node resides or in which it is physically located, 334. The environmental control system can then direct adjusted environmental control output for the identified zone, 336.

The master node may send a message to the slave node to adjust its performance in response to a condition detected by the slave node, 338. The slave node receives the message and adjusts its performance based on the message, 340.

Figure 4:
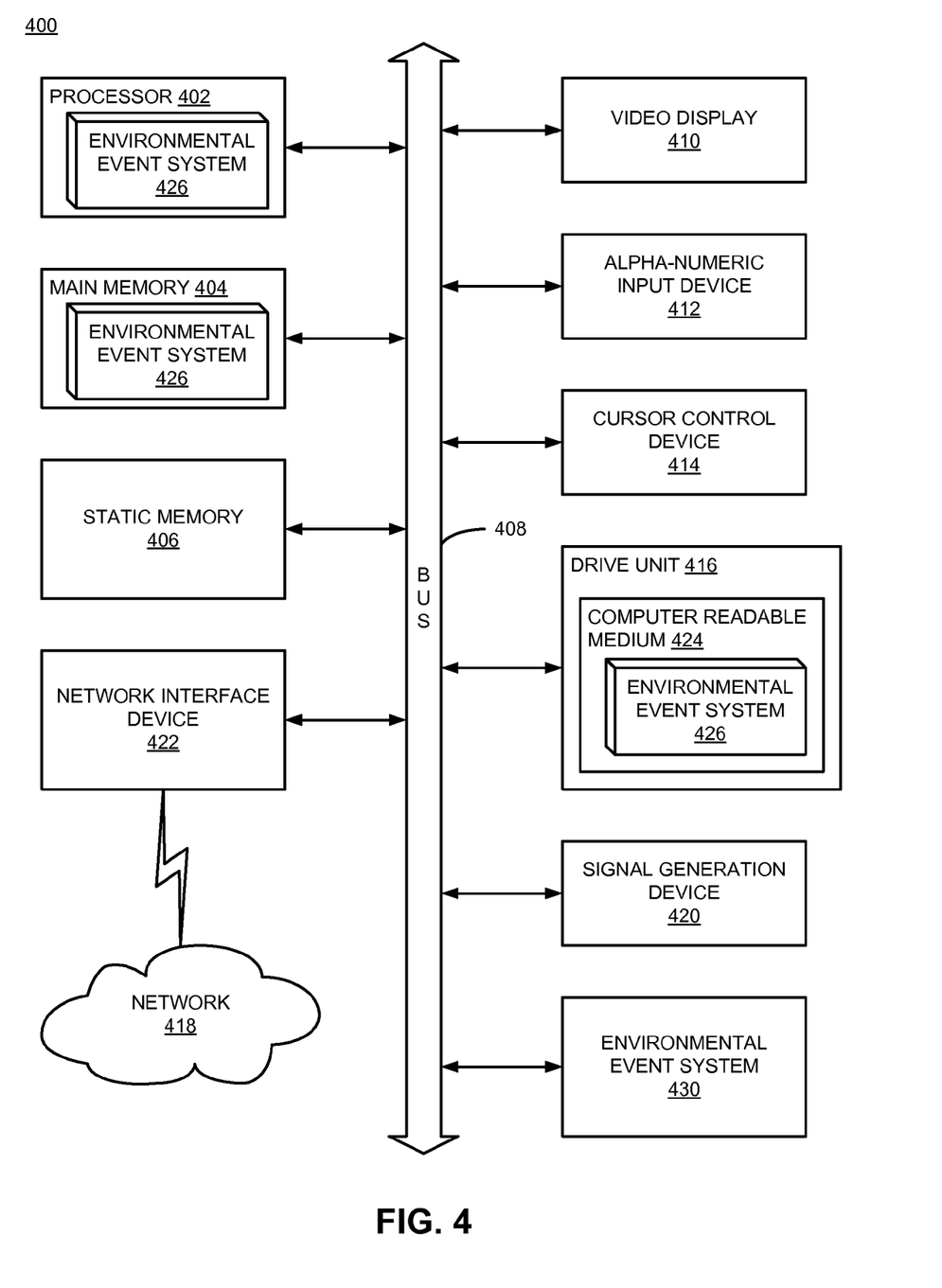
FIG. 4 is a block diagram of a computing device on which embodiments of the invention may be implemented.

FIG. 4 illustrates a diagrammatic representation of a machine in the exemplary form of a computer system 400 within which a set of instructions, for causing the machine to perform any one or more of the methodologies discussed herein, may be executed. Within the computer system 400 is a set of instructions for causing the machine to perform any one or more of the methodologies discussed herein. In alternative embodiments, the machine may be connected (e.g., networked) to other machines in a LAN, an intranet, an extranet, or the Internet. The machine can operate in the capacity of a server or a client machine (e.g., a client computer executing the browser and the server computer executing the automated task delegation and project management) in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 400 includes a processing device 402, a main memory 404 (e.g., read-only memory (ROM), flash memory, dynamic random access memory (DRAM) such as synchronous DRAM (SDRAM), etc.), a static memory 406 (e.g., flash memory, static random access memory (SRAM), etc.), and a secondary memory 416 (e.g., a data storage device in the form of a drive unit, which may include fixed or removable computer-readable storage medium), which communicate with each other via a bus 408.

Processing device 402 represents one or more general-purpose processing devices such as a microprocessor, central processing unit, or the like. More particularly, the processing device 402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. Processing device 402 is configured to execute the environmental event system 426 for performing the operations and steps discussed herein.

The computer system 400 may further include a network interface device 422. The computer system 400 also may include a video display unit 410 (e.g., a liquid crystal display (LCD) or a cathode ray tube (CRT)) connected to the computer system through a graphics port and graphics chipset, an alphanumeric input device 412 (e.g., a keyboard), a cursor control device 414 (e.g., a mouse), and a signal generation device 420 (e.g., a speaker).

The secondary memory 416 may include a machine-readable storage medium (or more specifically a computer-readable storage medium) 424 on which is stored one or more sets of instructions (e.g., the environmental event system 426) embodying any one or more of the methodologies or functions described herein. The environmental event system 426 may also reside, completely or at least partially, within the main memory 404 and/or within the processing device 402 during execution thereof by the computer system 400, the main memory 404 and the processing device 402 also constituting machine-readable storage media. The environmental event system 426 may further be transmitted or received over a network 418 via the network interface device 422.

The computer-readable storage medium 424 may also be used to store the environmental event system 426 persistently. While the computer-readable storage medium 424 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media.

In one embodiment, one or more modules 430 implement the environmental event system described herein, and modules 430, components, and other features described herein (for example in relation to FIGS. 1 and 2) can be implemented as discrete hardware components or integrated in the functionality of hardware components such as ASICS, FPGAs, DSPs or similar devices. In addition, modules 430 can be implemented as firmware or functional circuitry within hardware devices. Further, modules 430 can be implemented in any combination hardware devices and software components.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "matching," "prompting," "selecting," "sending," "generating," "displaying" or the like, refer to the actions and processes of a computer system, or similar electronic computing device that manipulates and transforms data represented as physical (electronic) quantities within the computer system's registers and memories into other data similarly represented as physical quantities within the computer system memories, registers or other such information storage, transmission or display devices.

The present invention also relates to an apparatus for performing the operations herein. This apparatus may be specially constructed for the required purposes or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, Flash memory devices including universal serial bus (USB) storage devices (e.g., USB key devices) or any type of media suitable for storing electronic instructions, each of which may be coupled to a computer system bus.

The algorithms and displays presented herein are not inherently related to any particular computer or other apparatus. Various general purpose systems may be used with programs in accordance with the teachings herein or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A computer-readable storage medium includes any mechanism for storing information in a form readable by a computer. For example, a computer-readable storage medium includes read only memory ("ROM"), random access memory ("RAM"), magnetic disk storage media; optical storage media, flash memory devices or other type of machine-accessible storage media.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communication interface to send data via the communication interface. A machine or computer readable storage medium may cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A computer-implemented method comprising:
    detecting a change in a condition that affects a thermal environment of a bounded space having multiple hardware devices that provide data access services,
        the bounded space having an environmental control system that manages the thermal environment of the bounded space,
        the multiple hardware devices further being part of an environmental event network comprising a master node that manages network-wide event responses, where the multiple hardware devices comprise a plurality of slave nodes of the environmental event network that integrates local conditions into the environmental event network; and
    exchanging an event message between the master node and a first slave node of the plurality of slave nodes to indicate the condition, and to cause an event message recipient to perform an operation to adjust the thermal environment of the bounded space in response to the event message, wherein the first slave node comprises a daemon to create a slave event message in response to the local conditions and to monitor for a master event message indicating a performance adjustment sent from the master node.

2. The method of claim 1, wherein the multiple hardware devices comprise servers.

3. The method of claim 1, wherein the multiple hardware devices comprise routers or data storage devices.

4. The method of claim 1, wherein the environment control system includes a system controller and multiple control points separated into zones to individually control a subportion of the bounded space.

5. The method of claim 1, wherein detecting the condition comprises:
    the master node receiving information from the environmental control system related to the thermal environment of the bounded space; and
    wherein exchanging the event message further comprises:
        the master node sending an event message to cause the slave node to adjust its performance based on the thermal environment of the bounded space.

6. The method of claim 1, wherein detecting the condition comprises:
    the master node receiving information related to performance requirements of the hardware devices from a business system; and
    wherein exchanging the event message further comprises:
        the master node sending an event message to cause the slave node to adjust its performance based on the thermal environment of the bounded space.

7. The method of claim 1, wherein detecting the condition comprises:
    a slave node detecting a condition based on local information; and
    wherein exchanging the event message further comprises:
        the slave node generating an event; and
        the slave node sending the event to the master node to cause the master node to perform an operation to adjust the environment of a section of the bounded space associated with the slave node.

8. The method of claim 7, wherein the slave node detecting the condition based on local information comprises:
    the slave node detecting one or more of a performance condition that causes the slave node to generate a different amount of heat, or a temperature condition of the processing equipment of the slave node.

9. The method of claim 7, wherein the slave node sending the event to the master node to cause the master node to perform the operation to adjust the environment comprises:
    the slave node sending the event to cause the master node to issue a command to one or more of the environmental control system to adjust the temperature of the bounded space, or issue a command to one or more slave nodes to cause the slave node(s) to adjust performance of the slave node(s).

10. A non-transitory computer-readable storage medium having instructions stored thereon, which when executed, cause a processor to perform operations including:
    detecting a change in a condition that affects a thermal environment of a bounded space having multiple hardware devices that provide data access services,
        the bounded space having an environmental control system that manages the thermal environment of the bounded space,
        the multiple hardware devices further being part of an environmental event network comprising a master node that manages network-wide event responses, where the multiple hardware devices comprise a plurality of slave nodes of the environmental event network that integrates local conditions into the environmental event network; and
    exchanging an event message between the master node and a first slave node of the plurality of slave nodes to indicate the condition, and to cause an event message recipient to perform an operation to adjust the thermal environment of the bounded space in response to the event message, wherein the first slave node comprises a daemon to create a slave event message in response to the local conditions and to monitor for a master event message indicating a performance adjustment sent from the master node.

11. The computer readable medium of claim 10, wherein the processor is a processor of the master node, and wherein the instructions for detecting the condition comprise instructions for receiving information from the environmental control system related to the thermal environment of the bounded space; and wherein the instructions for exchanging the event message further comprise instructions for sending an event message to cause the slave node to adjust its performance based on the thermal environment of the bounded space.

12. The computer readable medium of claim 10, wherein the processor is a processor of the slave node, and wherein the instructions for detecting the condition comprise instructions for detecting a condition based on local information; and wherein the instructions for exchanging the event message further comprise instructions for generating an event; and sending the event to the master node to cause the master node to perform an operation to adjust the environment of a section of the bounded space associated with the slave node.

13. The computer readable medium of claim 12, wherein the processor is a processor of the slave node, and wherein the instructions for detecting the condition based on local information comprise instructions for detecting one or more of a performance condition that causes the slave node to generate a different amount of heat, or a temperature condition of the processing equipment of the slave node.

14. The computer readable medium of claim 12, wherein the processor is a processor of the slave node, and wherein the instructions for sending the event to the master node to cause the master node to perform the operation to adjust the environment comprise instructions for sending the event to cause the master node to issue a command to one or more of the environmental control system to adjust the temperature of the bounded space, or issue a command to one or more slave nodes to cause the slave node(s) to adjust performance of the slave node(s).

15. A computing device comprising:

a data interface having a port with a socket to send and receive environmental condition information of an environmental condition that affects a thermal environment of a bounded space in which the computing device is physically located, where the bounded space has an environmental control system that manages the thermal environment of the bounded space, and the computing device is one of multiple hardware devices that are part of an environmental event network comprising a master node that manages network-wide event responses, where the multiple hardware devices comprise a plurality of slave nodes of the environmental event network that integrates local conditions into the environmental event network; and a daemon module that detects a change in the environmental condition, and exchanges an event message with another node of the environmental event network, the event message to cause an event message recipient to perform an operation to adjust the thermal environment of the bounded space in response to the event message, wherein the daemon module creates the event message in response to the local conditions and monitors for a master event message indicating a performance adjustment sent from the master node.

16. The computing device of claim 15, wherein the computing device is the master node of the environmental event network, and wherein detecting the change in the environmental condition comprises receiving an indication of a condition from one of a batch process, a scheduler, a sensor of the environmental control system, or a slave node.

17. The computing device of claim 15, wherein the computing device is a slave node of the environmental event network, and wherein detecting the change in the environmental condition comprises one of reading an internal temperature, detecting a change in a workload, or detecting a change in a number of requests for processing.

18. An environmental event system, comprising:

a slave node comprising a server that processes data requests for client devices, the slave node to include a daemon module to monitor local environmental condition information related to a local thermal condition of the slave node, the daemon module to create a slave event message in response to the local environmental condition and to monitor for a master event message indicating a performance adjustment sent from a master node, and an interface to communicate environmental condition information, wherein the slave node is one node of a bounded space that has multiple slave nodes in a environmental event network; and the master node of the environmental event system to control behavior of the environmental event system, the master node to include a daemon module to receive local the environmental condition information from the slave node and determine one or more actions to adjust the local thermal condition of the slave node based on the received environmental condition information.

19. The environmental event system of claim 18, wherein the daemon modules are kernel-level modules.

20. The environmental event system of claim 18, wherein the master node interfaces with an environmental control system to adjust cooling directed to the slave node in response to the received environmental condition information to adjust the local thermal condition of the slave node.

21. The environmental event system of claim 20, wherein the master node further receives information related to one or more of: limits of cooling capacity and status of the environmental control system, capacity and status of a power system of the bounded space, or minimum and maximum power usage for a the slave node.

* * * * *